(12) United States Patent
Zhu

(10) Patent No.: US 7,295,448 B2
(45) Date of Patent: Nov. 13, 2007

(54) INTERLEAVED POWER CONVERTER

(75) Inventor: Lizhi Zhu, Canton, MI (US)

(73) Assignee: Siemens VDO Automotive Corporation, Auburn Hills, MI (US)

(*) Notice: Subject to any disclaimer, the term of this patent is extended or adjusted under 35 U.S.C. 154(b) by 14 days.

(21) Appl. No.: 10/861,319

(22) Filed: Jun. 4, 2004

(65) Prior Publication Data
US 2005/0270806 A1   Dec. 8, 2005

(51) Int. Cl.
*H02M 3/335* (2006.01)
(52) U.S. Cl. .......................... 363/17; 363/65; 363/132
(58) Field of Classification Search .................. 363/16, 363/17, 65, 67, 131, 142, 132; 336/200
See application file for complete search history.

(56) References Cited

U.S. PATENT DOCUMENTS

| | | | |
|---|---|---|---|
| 4,142,231 A | 2/1979 | Wilson et al. ............... | 363/141 |
| 4,224,663 A | 9/1980 | Maiese et al. ............... | 363/144 |
| 4,458,305 A | 7/1984 | Buckle et al. ............... | 363/141 |
| 4,661,897 A | 4/1987 | Pitel ............................ | 363/17 |
| 4,674,024 A | 6/1987 | Paice et al. ................... | 363/71 |
| 5,172,310 A | 12/1992 | Deam et al. ................. | 363/144 |
| 5,184,291 A | 2/1993 | Crowe et al. ................ | 363/37 |
| 5,230,632 A | 7/1993 | Baumberger et al. ......... | 439/66 |
| 5,243,757 A | 9/1993 | Grabbe et al. ................ | 29/882 |
| 5,264,761 A | 11/1993 | Johnson ....................... | 315/291 |
| 5,395,252 A | 3/1995 | White .......................... | 439/66 |
| 5,422,440 A | 6/1995 | Palma ..................... | 174/133 B |
| 5,439,398 A | 8/1995 | Testa et al. .................. | 439/801 |
| 5,445,526 A | 8/1995 | Hoshino et al. .............. | 439/69 |
| 5,459,356 A | 10/1995 | Schulze et al. .............. | 257/773 |
| 5,508,560 A | 4/1996 | Koehler et al. .............. | 257/730 |
| 5,537,074 A | 7/1996 | Iversen et al. ............... | 327/564 |
| 5,559,374 A | 9/1996 | Ohta et al. .................... | 257/723 |
| 5,635,751 A | 6/1997 | Ikeda et al. .................. | 257/584 |
| 5,653,598 A | 8/1997 | Grabbe .......................... | 439/66 |
| 5,756,935 A | 5/1998 | Balanovsky et al. ........ | 174/52.1 |
| 5,847,951 A | 12/1998 | Brown et al. ................ | 363/147 |
| 5,938,451 A | 8/1999 | Rathburn ...................... | 439/66 |
| 5,973,923 A | 10/1999 | Jitaru .......................... | 361/704 |
| 5,975,914 A | 11/1999 | Uchida .......................... | 439/66 |
| 6,038,156 A | 3/2000 | Inam et al. .................. | 363/133 |
| 6,054,765 A | 4/2000 | Eytcheson et al. .......... | 257/724 |

(Continued)

FOREIGN PATENT DOCUMENTS

DE  195 19 538 A1  11/1996

(Continued)

OTHER PUBLICATIONS

Mohan et al., *Power Electronics: Converters, Applications and Designs*, John Wiley & Sons Inc., USA, 1989, Chapter 26-8, "Circuit Layout," p. 654, no month.

(Continued)

*Primary Examiner*—Jessica Han

(57) ABSTRACT

A power converter architecture interleaves full bridge converters to alleviate thermal management problems in high current applications, and may, for example, double the output power capability while reducing parts count and costs. For example, one phase of a three phase inverter is shared between two transformers, which provide power to a rectifier such as a current doubler rectifier to provide two full bridge DC/DC converters with three rather than four high voltage inverter legs.

27 Claims, 10 Drawing Sheets

U.S. PATENT DOCUMENTS

| | | | |
|---|---|---|---|
| 6,072,707 A | 6/2000 | Hochgraf | 363/71 |
| 6,078,173 A | 6/2000 | Kumar et al. | 324/158.1 |
| 6,078,501 A | 6/2000 | Catrambone et al. | 361/704 |
| 6,144,276 A | 11/2000 | Booth | 336/61 |
| 6,166,937 A | 12/2000 | Yamamura et al. | 363/141 |
| 6,176,707 B1 | 1/2001 | Neidich et al. | 439/66 |
| 6,211,767 B1 | 4/2001 | Jitaru | 336/200 |
| 6,212,087 B1 | 4/2001 | Grant et al. | 363/144 |
| 6,222,437 B1 * | 4/2001 | Soto et al. | 336/200 |
| 6,233,149 B1 | 5/2001 | Bailey et al. | 361/704 |
| 6,278,354 B1 | 8/2001 | Booth | 336/200 |
| 6,292,371 B1 | 9/2001 | Toner, Jr. | 361/752 |
| 6,388,898 B1 * | 5/2002 | Fan et al. | 363/17 |
| 6,434,008 B1 | 8/2002 | Yamada et al. | 361/728 |
| 6,498,320 B2 * | 12/2002 | Moriguchi et al. | 363/142 |
| 6,603,672 B1 | 8/2003 | Deng et al. | 363/37 |
| 7,015,658 B2 * | 3/2006 | Tsay et al. | 363/131 |
| 2002/0034088 A1 | 3/2002 | Parkhill et al. | 363/144 |
| 2002/0109152 A1 | 8/2002 | Kobayashi et al. | 257/177 |
| 2002/0111050 A1 | 8/2002 | Parkhill et al. | 439/65 |
| 2002/0118560 A1 | 8/2002 | Ahmed et al. | 363/144 |
| 2002/0126465 A1 | 9/2002 | Maly et al. | 361/818 |
| 2002/0167828 A1 | 11/2002 | Parkhill et al. | 363/144 |
| 2003/0007366 A1 | 1/2003 | Drummond et al. | 363/17 |
| 2004/0228094 A1 | 11/2004 | Ahmed et al. | 361/702 |

FOREIGN PATENT DOCUMENTS

| | | |
|---|---|---|
| EP | 0 427 143 A2 | 5/1991 |
| EP | 0 578 108 A1 | 1/1994 |
| JP | 9-117126 | 5/1997 |

OTHER PUBLICATIONS

Persson, E., "Power Electronic Design and Layout Techniques for Improved Performance and Reduced EMI," in Proceedings of Power Electronics in Transportation, *IEEE*, Dearborn, Michigan, Oct. 20-21, 1994, pp. 79-82.

U.S. Appl. No. 60/233,992, filed Sep. 20, 2000, Parkhill et al.
U.S. Appl. No. 60/233,993, filed Sep. 20, 2000, Parkhill et al.
U.S. Appl. No. 60/233,994, filed Sep. 20, 2000, Parkhill et al.
U.S. Appl. No. 60/233,995, filed Sep. 20, 2000, Parkhill et al.
U.S. Appl. No. 60/233,996, filed Sep. 20, 2000, Parkhill et al.
U.S. Appl. No. 60/471,387, filed May 16, 2003, Flett et al.

Easler, K., "Continued Study in Power Module Substrates for Automotive Harsh Environments," Kyocera America, Inc., 4 pages, dated no earlier than Nov. 2002.

de Sorgo, M., "A Thermal Comparison of Power Device Mounting Technologies," Chomerics, 7 pages, Dec. 1, 2000.

Sugai, K., et al., "A New Structure of Low Inductance Ceramic Substrate for Power Module," in *Proceedings of the 3rd Intl. Congress for 42V PowerNet*, Munich, Germany, Nov. 12-14, 2002, 13 pages.

Boroyevich, D., et al., "A View at the Future of Integration in Power Electronics Systems," in *Proceedings of the PCIM Europe 2005*, Nuremberg, Germany, Jun. 7, 2005, pp. 11-20.

Lee, F., et al., "Technology Trends Toward a System-in-a-Module in Power Electronics," *IEEE Circuits and Systems Magazine,*, 2(4):4-23, Fourth Quarter 2002.

Hirokawa, M., et al., "Improvement of Transient Response in High-Current Output DC—DC Converters," in *Proceedings of the 18th Annual IEEE Applied Power Electronics Conference and Exposition*, Miami Beach, FL, Feb. 9-13, 2003, pp. 705-710.

Panov, Y., et al., "Design and Performance Evaluation of Low-Voltage/High-Current DC/DC On-Board Modules," in *Proceedings of the 14th Annual IEEE Applied Power Electronics Conference and Exposition*, Dallas, TX, Mar. 14-18, 1999, pp. 545-552.

Xu, P., et al., "A Family of Novel Interleaved DC/DC Converters for Low-Voltage High-Current Voltage Regulator Module Applications," in *Proceedings of the 32nd Annual IEEE Power Electronics Specialists Conference*, Vancouver, Canada, Jun. 17-21, 2001, pp. 1507-1511.

* cited by examiner

INTERLEAVED POWER CONVERTER

STATEMENT OF GOVERNMENT INTEREST

This invention was made with government support under Subcontract No. 400029752, Prime Contract No. DE-AC05-00OR22725, awarded by the Department of Energy. The government has certain rights in this invention.

BACKGROUND OF THE INVENTION

1. Field of the Invention

This disclosure generally relates to electrical power systems, and more particularly to power module architectures suitable for rectifying, inverting, and/or converting electrical power between power sources and loads.

2. Description of the Related Art

Power modules are typically self-contained units that transform and/or condition power from one or more power sources for supplying power to one or more loads. Power modules commonly referred to as "inverters" transform direct current (DC) to alternating current (AC), for use in supplying power to an AC load. Power modules commonly referred to as "rectifiers" transform AC to DC. Power modules commonly referred to as "DC/DC converters" step up or step down a DC voltage. An appropriately configured and operated power module may perform any one or more of these functions. The term "converter" commonly applies generically to all power modules whether inverters, rectifiers and/or DC/DC converters, and is used herein in that generic sense.

Many applications employ the delivery of high power, high current and/or high voltage from a power source to a load. For example, transportation applications may employ high power to drive a load such as a traction motor for propelling an electric or hybrid electric vehicle. Such applications may employ one or more of a variety of power sources, for example, energy producing power sources such as arrays of fuel cells or photovoltaic cells, and/or energy storage power sources such as arrays of battery cells and/or super capacitors. Often, such applications employ a power converter to transform and/or condition the power, for example, stepping down the voltage at which the power is supplied to the load.

Power converters typically employ power semiconductor devices, such as insulated gate bipolar transistors (IGBTs), metal oxide semiconductor field effect transistors (MOSFETs), and/or semiconductor diodes. These power semiconductor devices dissipate large amounts of heat during high power operation, creating thermal management problems which may limit the operating range, increase cost, increase size and/or weight, adversely effect efficiency, and/or reduce reliability of the power converter.

Methods and, or architectures for power converters capable of high power operation that alleviate the thermal management problems are highly desirable.

BRIEF SUMMARY OF THE INVENTION

In one aspect, a power converter comprises: an inverter circuit comprising a first phase leg comprising a first node, a second phase leg comprising a second node, and a third phase leg comprising a third node; a first transformer comprising a first side and a second side, the first side of the first transformer electrically coupled between the first node of the first phase leg and the second node of the second phase leg of the inverter circuit; and a second transformer comprising a first side and a second side, the first side of the second transformer electrically coupled between the first node of the first phase leg and the third node of the third phase leg of the inverter circuit.

In another aspect, a method of converting power comprises: inverting a direct current to produce at least three phases of alternating current; supplying a first and a second of the three phases of alternating current to a first side of a first transformer to induce an alternating current on a second side of the first transformer; supplying the second and a third of the three phases of alternating current to a first side of a second transformer to induce an alternating current on a second side of the second transformer; supplying the alternating current from the second side of the first transformer to a rectifier; supplying the alternating current from the second side of the second transformer to the rectifier; and rectifying the first and the second alternating currents supplied to the rectifier from the second sides of the first and the second transformers, respectively, to produce a first voltage across a first potential node and a second potential node and to produce a second voltage across the second potential node and a third potential node.

In a further aspect, a power converter comprises: a first transformer comprising a first side including at least a first pole and a second pole, and a second side including at least a first pole and a second pole; a second transformer comprising a first side including at least a first pole and a second pole, and a second side including at least a first pole and a second pole; means for supplying a first phase of alternating current to the first pole of the first side of the first transformer, a second phase of alternating current to the second pole of the first side of the first transformer and to the first pole of the first side of the second transformer, and a third phase of alternating current to the second pole of the first side of the second transformer; and means for current double rectifying alternating currents supplied from the second sides of the first and the second transformers.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

Figure 5A:
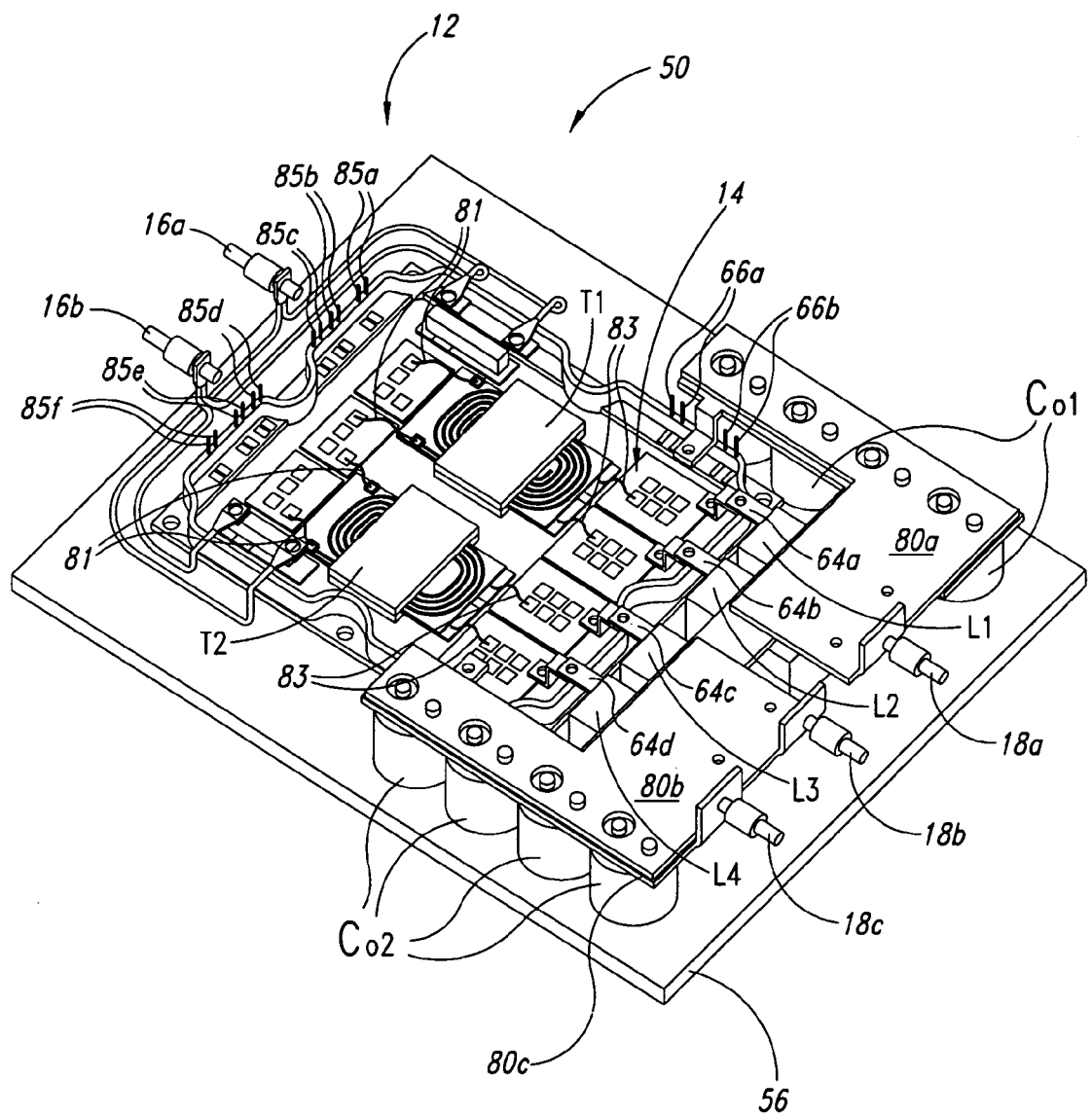
FIG. 5A is a top left front isometric view of a power converter according to another illustrated embodiment, in which the inverter and filter inductors are in the module housing.
Figure 5B:
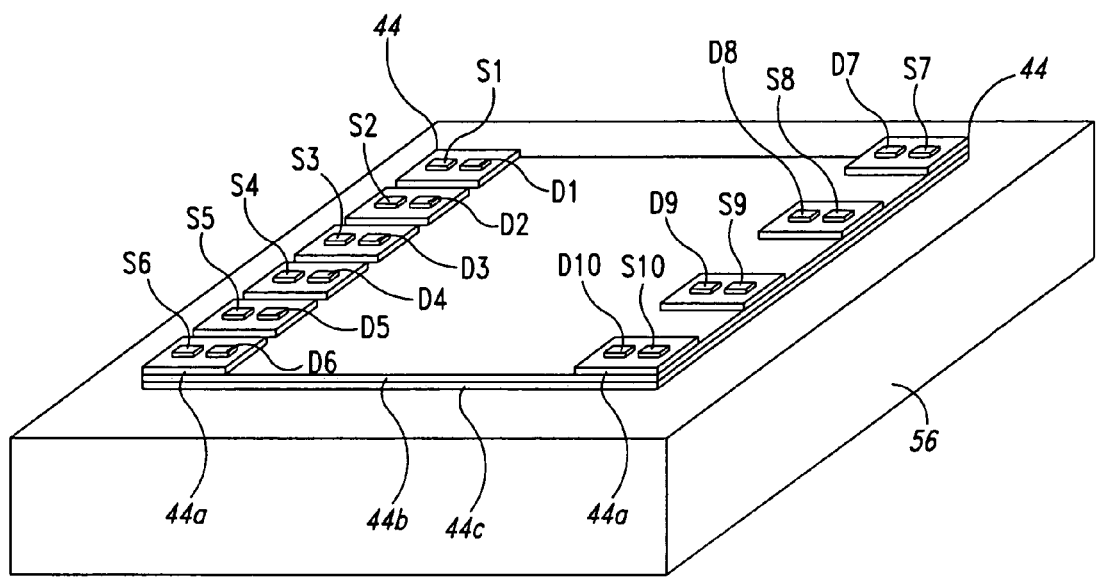
FIG. 5B is a top front left isometric view of a portion of an integrated base plate heat sink showing a single multi-layer switch substrate comprising ten distinct areas formed in an electrically and thermally coupled layer to physically and thermally couple respective switches of the rectifier and inverter to the integrated base plate heat sink, according to another illustrated embodiment.
Figure 5C:
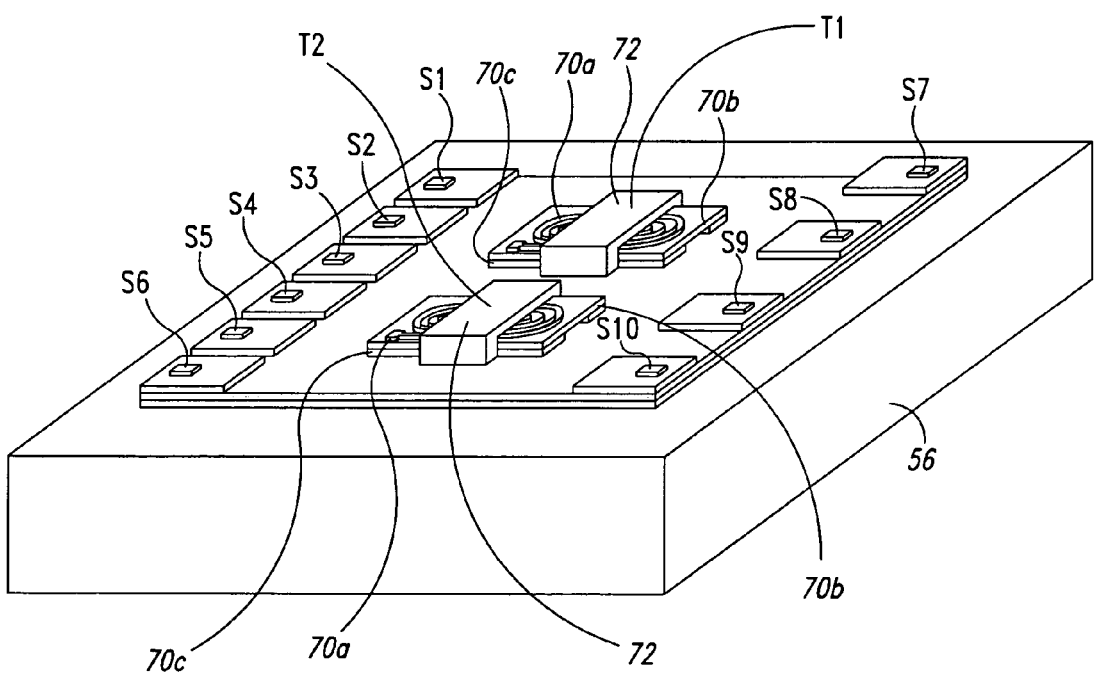

FIG. 5C is a top front left isometric view of a portion of an integrated base plate heat sink showing a single multi-layer switch substrate comprising ten distinct areas formed in an electrically and thermally coupled layer to physically and thermally couple respective switches of the rectifier and inverter to the integrated base plate heat sink, as well as area for forming the windings of the two transformers, according to another illustrated embodiment.

Figure 5D:
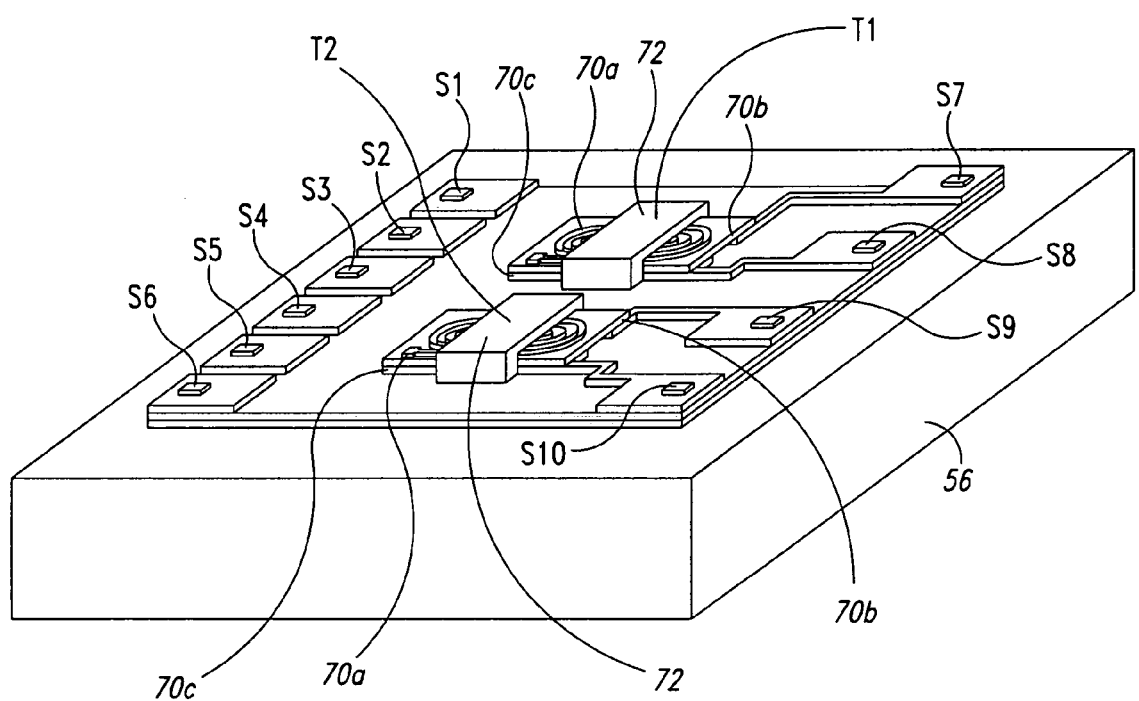

FIG. 5D is a top front left isometric view of a portion of an integrated base plate heat sink similar to that of FIG. 5C, showing the use of one of the electrically and thermally conductive layers of the multi-layer substrate electrically coupling the second side of the transformers to respective terminals of the power semiconductor switches of the rectifier.

Figure 6:
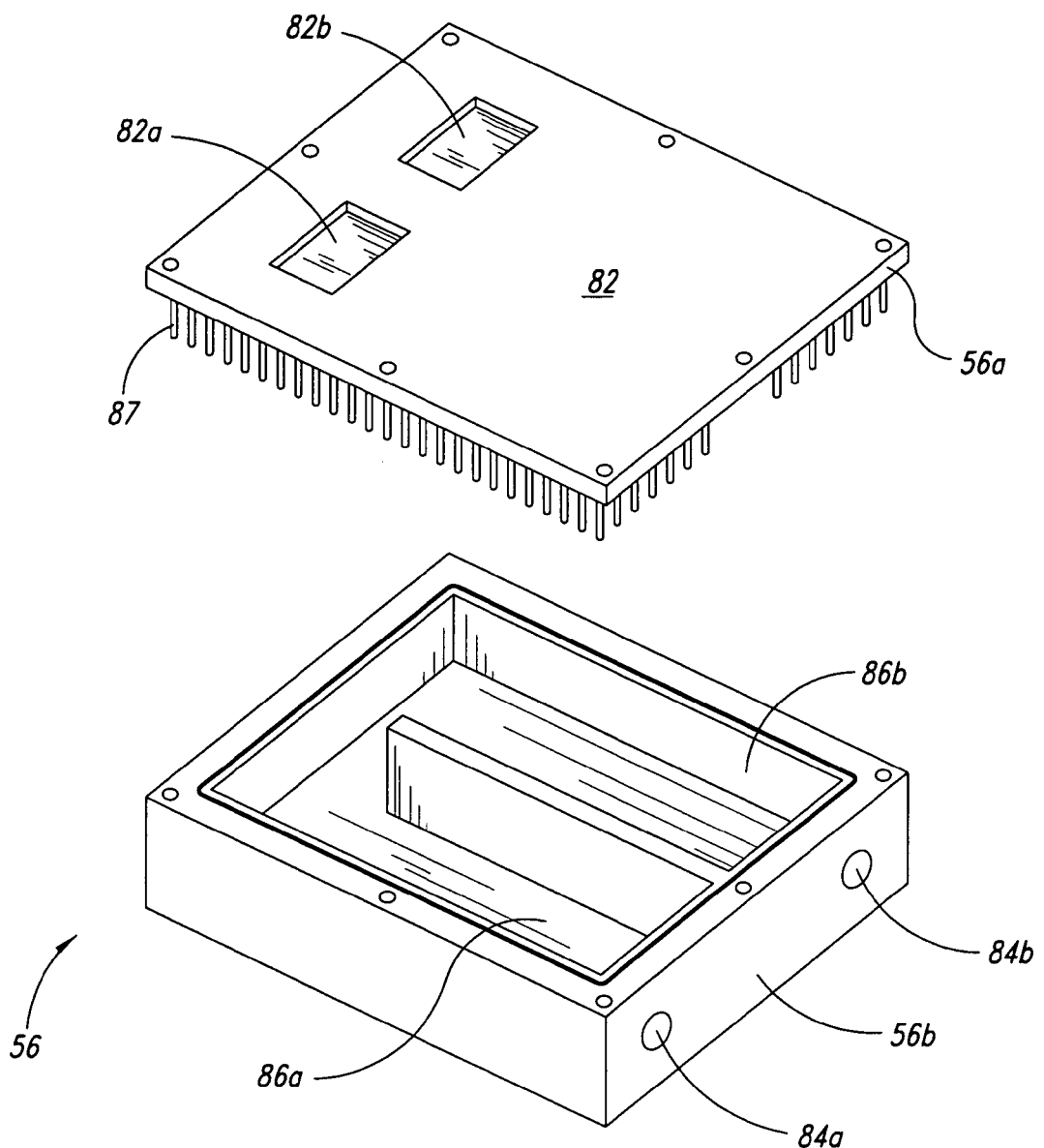

FIG. 6 is a top front left isometric view of the integrated base plate heat sink according to one illustrated embodiment.

Figure 7:
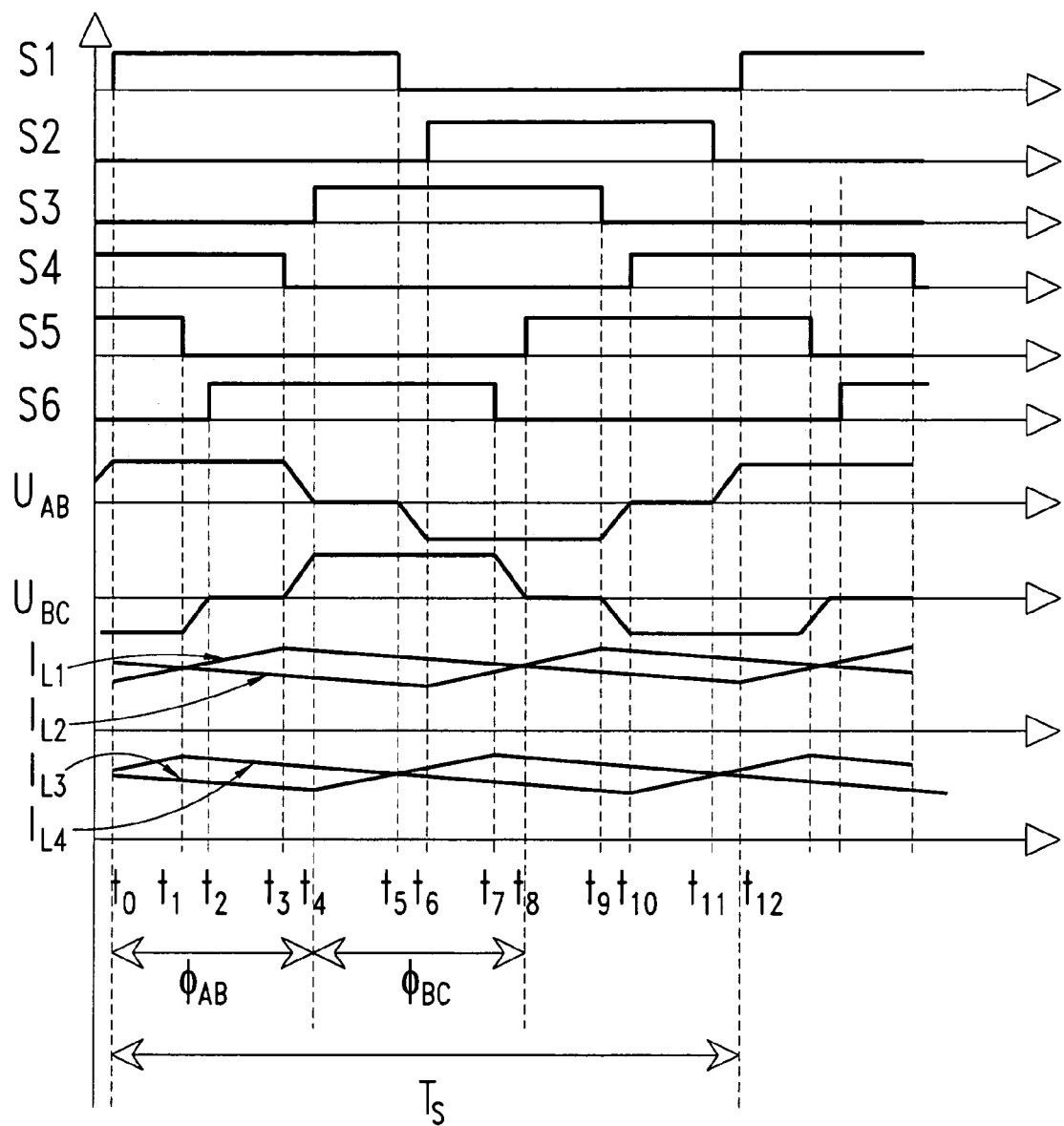

FIG. 7 is a graph illustrating control signals for controlling operation of the power converter, as well as resulting voltage and current plots, according to one illustrated embodiment.

DETAILED DESCRIPTION OF THE INVENTION

In the following description, certain specific details are set forth in order to provide a thorough understanding of various embodiments. However, one skilled in the art will understand that the invention may be practiced without these details. In other instances, well-known structures associated with power converters, controllers and/or gate drives have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Further more, the particular features, structures, or characteristics may be combined in any suitable manner in one or more embodiments.

The headings provided herein are for convenience only and do not interpret the scope or meaning of the claimed invention.

Figure 1:
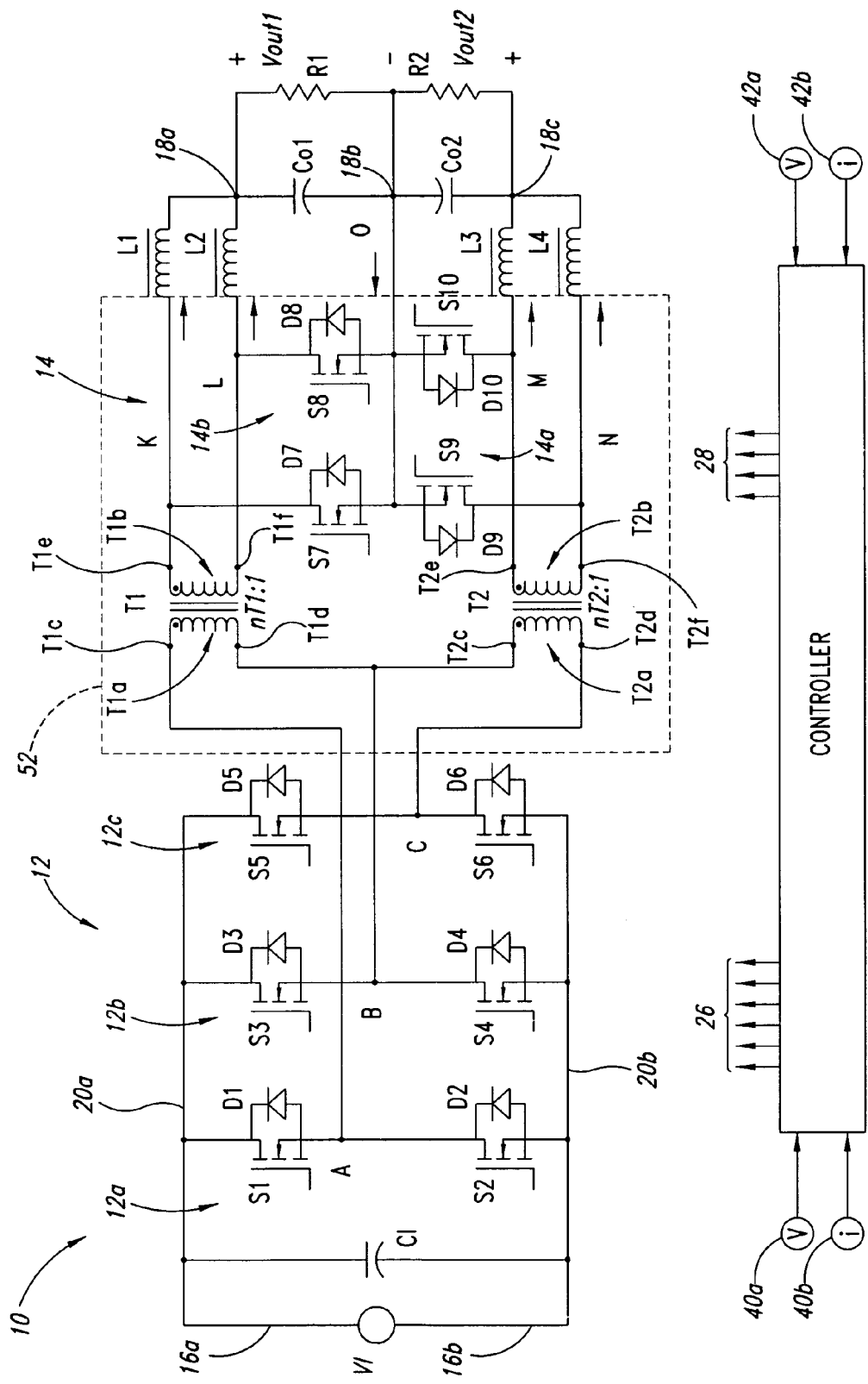
FIG. 1 is an electrical schematic of a power converter according to one illustrated embodiment.

FIG. 1 shows a power converter 10, according to one illustrated embodiment in which the power converter 10 takes the form of a DC/DC power converter. The power converter 10 is operable to transform and/or condition power supplied by a power source VI for supply to one or more loads R1, R2. The power converter 10 may comprise an inverter 12, a rectifier 14, and a pair of transformers T1, T2 galvanically coupling the inverter 12 with the rectifier 14. The power converter 10 may also comprise a pair terminals 16a, 16b, which may be electrically coupled to receive power from the power source VI. The power source VI may, for example, take the form one or more energy producing power sources such as arrays of fuel cells or photovoltaic cells, and/or may take the form of one or more energy storage power sources such as arrays of battery cells and/or super capacitors. The power converter 10 also comprises a set of terminals 18a, 18b, 18c, which may be electrically coupled to supply power to one or more loads R1, R2.

The inverter 12 comprises an inverter side bus 20 (collectively) formed by voltage rails 20a, 20b. The inverter 12 also comprises a first phase leg 12a formed by an upper power semiconductor switch S1 and lower power semiconductor switch S2, a second phase leg 12b formed by an upper power semiconductor switch S3 and lower power semiconductor switch S4, and a third phase leg 12c formed by an upper power semiconductor switch S5 and lower power semiconductor switch S6, each of the phase legs 12a–12c electrically coupled between the voltage rails 20a, 20b. The power semiconductor switches S1–S6 may, for example, take the form of metal oxide semiconductor field effect transistors (MOSFETs), insulated gate bipolar transistors (IGBTs) and/or other switches suitable for high power operation.

The inverter 12 further comprises power semiconductor diodes D1–D6, electrically coupled in anti-parallel across respective ones of the power semiconductor switches S1–S6. As used herein and in the claims, the term "power semiconductor device" includes semiconductor devices designed to handle large currents, large voltages and/or large amounts of power with respect to standard semiconductor devices, including power semiconductor switches devices, power semiconductor diodes, and other such devices used in power distribution, for example, grid or transportation related applications. In some embodiments, the power semiconductor diodes D1–D6 may be formed as part of the power semiconductor switches S1–S6, for example as body diodes, while in other embodiments the power semiconductor diodes D1–D6 may take the form of discrete semiconductor devices.

Between the pair of power semiconductor switches S1, S2, S3, S4, S5, S6 forming each phase leg 12a, 12b, 12c respectively, is a phase node A, B, C, upon which the respective phase of a three phase output of the inverter 12 appears during operation. While illustrated as a single switch and diode, each of the power semiconductor switches S1–S6 and/or diodes D1–D6 may take the form of one or more power semiconductor switches and/or diodes electrically coupled in parallel. A controller 24 controls the power semiconductor switches S1–S6 via control signals 26.

The inverter 12 may further comprise an input capacitor CI, electrically coupled across the voltage rails 20a, 20b of the inverter side bus 20.

The rectifier 14 may take the form of an active rectifier, such as the current doubler rectifier illustrated in FIG. 1. The rectifier 14 comprises a first leg 14a formed by an upper power semiconductor switch S7 and lower power semiconductor switch S9, and a second leg 14b formed by an upper power semiconductor device switching S8 and lower power semiconductor device switch S10. The rectifier 14 also comprises power semiconductor diodes D7–D10, electrically coupled in anti-parallel across respective ones of the power semiconductor switches S7–S10, respectively. In some embodiments, the power semiconductor diodes D7–D10 may be formed as part of the power semiconductor switches S7–S10, for example as body diodes, while in other embodiments the power semiconductor diodes D7–D10 may take the form of discrete semiconductor devices. While illustrated as a single switch and diode, each of the power semiconductor switches S7–S10 and/or diodes D7–D10 may take the form of one or more power semiconductor switches and/or diodes electrically coupled in parallel.

A node between each of the first and the second legs 14a, 14b of the rectifier 14 are electrically coupled to one another to provide a neutral node O for the rectifier 14. The controller 24 controls the power semiconductor switches S7–S10 via control signals 28.

The transformers T1, T2 may be high frequency transformers, which provide galvanic isolation, and voltage step up/step down between the inverter side and the rectifier side of the power converter 10. Each transformer T1, T2 share half the power of the power converter 10.

The first transformer T1 comprises a first side T1a and a second side T1b. Where power is transferred from the power source VI to the load(s) R1, R2, the first side T1a is typically referred to as the primary winding and the second side T1b as the secondary winding. In some embodiments, power may transfer in the opposite direction, for example during regenerative braking power may transfer from the "load(s)" R1, R2 (e.g., electric machine) to the "power source" VI (e.g., battery and/or super-capacitor). Consequently, the terms first and second side are used throughout this description and in the claims to generically refer to the windings of the transformers T1, T2 without regard to the direction of power transfer. Likewise, as used throughout this description and in the claims, the load(s) R1, R2 may consume power in a first mode (e.g., driving), while generating power in a second mode (e.g., regenerative braking), and the power supply VI may provide power in the first mode, while consuming or storing power in the second mode. Other modes and operations are possible.

The first side T1a of the first transformer T1 includes a pair of poles T1c, T1d, and the second side T1b also includes a pair of poles T1e, T1f. Likewise, the second transformer T2 comprises a first side T2a and a second side T2b. The first side T2a of the second transformer T2 includes a pair of poles T1c, T1d, and the second side T2b includes a pair of poles T2e, T2f. The second side T2b of the second transformer T2 is electrically coupled to respective current paths K, L, M, N that form a rectifier side bus which also includes the neutral node O of the rectifier 14.

The phase node A of the first phase leg 12a of the inverter 12 is electrically coupled to the first pole T1c of the first side T1a of the first transformer T1. The phase node B of the second phase leg 12b of the inverter 12 is electrically coupled to the second pole T1d of the first side T1a of the first transformer T1, and coupled to the first pole T2c of the first side T2a of the second transformer T2. The phase node C of the third phase leg 12c of the inverter 12 is electrically coupled to the second pole T2d of the first side T2a of the second transformer T2.

The first leg 14a of the rectifier 14 is electrically coupled between the first pole T1e of the second side T1b of the first transformer T1 via current path K and the second pole T2f of the second side T2b of the second transformer T2 via current path N. The second leg 14b of the rectifier 14 is electrically coupled between the second pole T1f of the second side T1b of this first transformer T1 via current path L and the first pole T2e of the second side T2b of the second transformer T2 via current path M. A filter inductor L1, L2, L3, L4 is electrically coupled between each pole T1e, T1f, T2e, T2f of the secondary sides T1c, T2c of the transformers T1, T2 via the current paths K, L, M, N and the terminals 18a–18c. The filter inductors L1–L4 share the load current. Output capacitors CO1, CO2 are electrically coupled across each pair of the terminals 18a–18b, 18b–18c.

The controller 24 provides control signals 26, 28 to control the power semiconductor switches S1-6 of the inverter 12 and/or the power semiconductor switches S7–S10 of the rectifier 14, respectively. The controller 24 may take the form of a microcontroller such as a microprocessor, digital signal processor (DSP) and/or application specific integrated circuit (ASIC). Controller 24 may receive input signals such as voltage and current measurements from a voltage sensor 40a and/or current sensor 40b that sense voltage or current with respect to the input from the power source VI. The controller 24 may additionally or alternatively receive voltage and/or current signals from a voltage sensor 42a and/or current sensor 42b that measure output voltage and/or current.

Figure 2A:
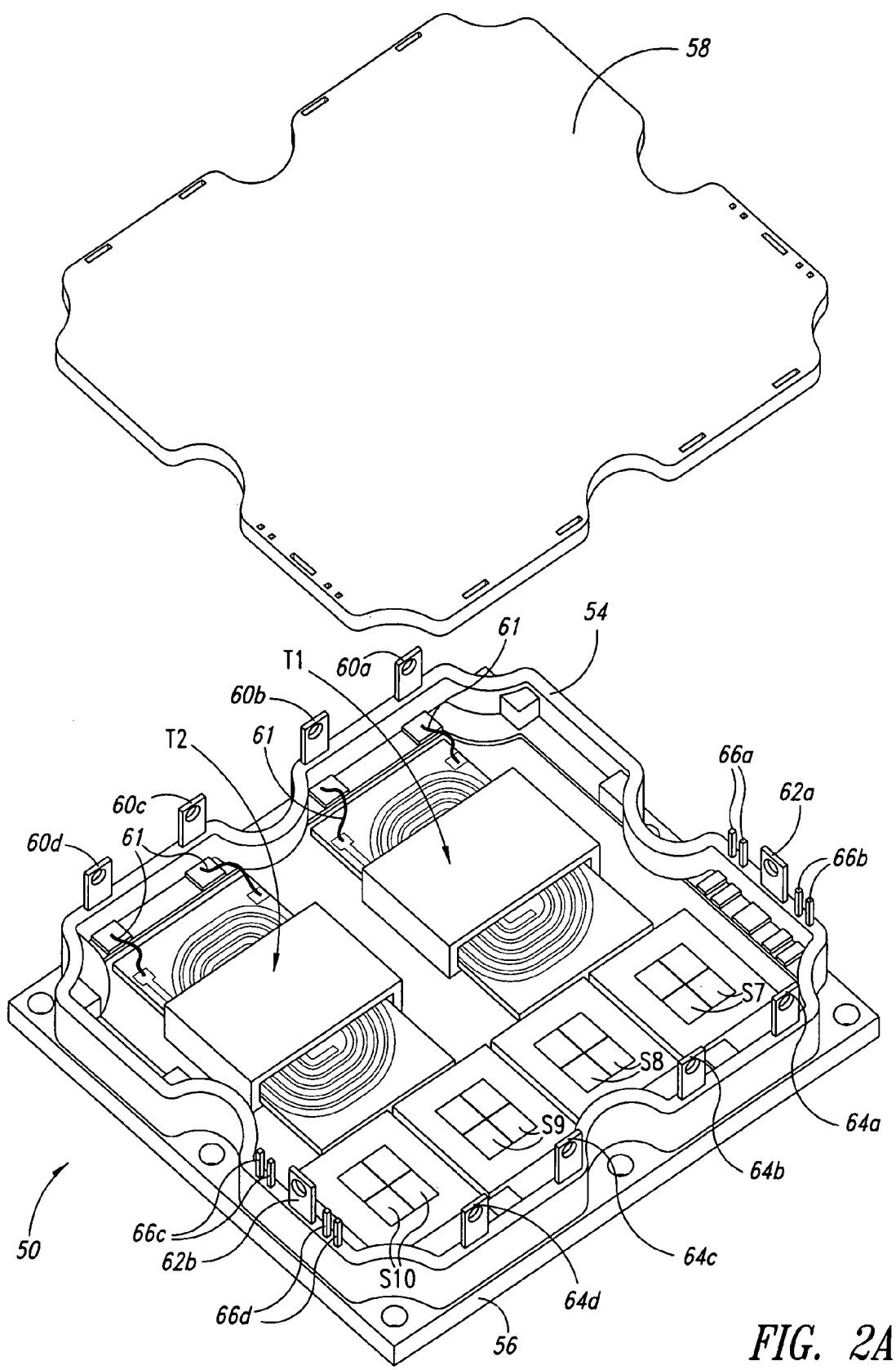
FIG. 2A is a top front left isometric view of a portion of the power converter of FIG. 1, with a cover removed from a module housing to show an inverter, a rectifier, two planar transformers, filter inductors, and an integrated base plate heat sink.

FIG. 2A shows a power module 50 according to one illustrated embodiment, the power module 50 housing a portion of the power converter 10 illustrated by broken line box 52 of FIG. 1. In particular, the power module 50 comprises an electrically insulative lead frame 54, an integrated base plate heat sink 56 and an electrically insulative cover 58, collectively forming a housing. The Figure does not separately call out the power semiconductor diodes D6–D10, which are formed as a part of the power semiconductor switches S6–S10 in this illustrated embodiment. As illustrated in FIG. 2A, each of the power semiconductor switches S6–S10 illustrated in FIG. 1 may actually take the form of one or more (four illustrated) power semiconductor switches S6–S10 electrically coupled in parallel with one another.

The lead frame 54 supports a number of external terminals or connectors making electrical couplings external from the housing formed by the lead frame 54, heat sink 56 and cover 58. For example, the power module 50 may include a number of terminals 60a–60d for making electrical couplings between the phase nodes A, B, C of the inverter 12 and the poles of the first sides T1a, T2a of the transformers T1, T2. In particular, a first terminal 60a, electrically couples the phase node A of the inverter 12 to the first pole T1c of the transformer T1, via wire bonds 61. A second terminal 60b and a third terminal 60c electrically couple the phase node B of the inverter 12 to the second pole T1d of the first transformer T1 and the first pole T2c of the second transformer T2, respectively, via wire bonds 61. A fourth terminal 60d electrically couples the phase node C of the inverter 12 to the second pole T2d of the second transformer T2 via wire bonds 61. While FIG. 2A only illustrates one wire bond 61 per electrical coupling, most practical applications with comprise a plurality of wire bonds for each electrical coupling.

Also for example, a number of terminals or connectors electrically couple the rectifier 14 to the filter inductors L1–L4 and to the terminals 18a–18c via wire bonds (not shown). For example, a pair of terminals 62a, 62b electrically couple the neutral node O of the rectifier 12 to the terminal 18b. Other terminals 64a–64d electrically couple the rectifier 14 and/or second sides T1b, T2b of the transformers T1, T2 to the filter inductors L1–L2, via the current paths K–N.

Terminals or connectors such as pins 66a, 66b, 66c, 66d electrically couple control signals 28 from the controller 24 to the power semiconductor switches S7–S10 of the rectifier 14 via wire bonds (not shown). The pins 66a–66d are located proximate the terminal 18b which is connected to the neutral node O.

Many of the electrical couplings within the power module 50 are advantageously made via wire bonds. For example, the electrical couplings between the terminals 60a–60d and the first side T1a, T2a of the transformers T1, T2, are made via wire bonds 61. Also for example, the electrical couplings between the second side T1b, T2b of the transformers T1, T2 and the power semiconductor switches S7–S10 and power semiconductor diodes D7–D10 are made via wire bonds (not shown). Further, the electrical couplings between terminals 62a, 62b, 64a–64b and the power semiconductor switches S7–S10 and power semiconductor diodes D7–D10 are also made via wire bonds (not shown).

Figure 2B:
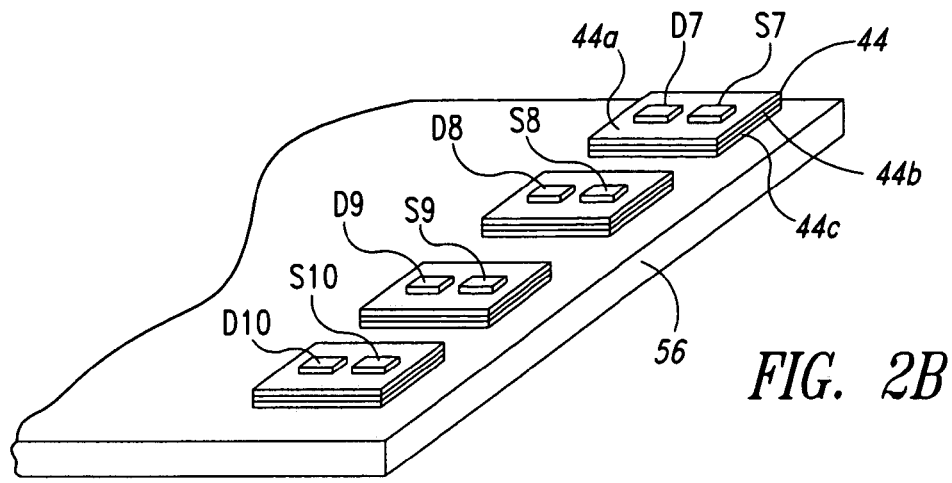
FIG. 2B is a top front left isometric view of a portion of an integrated base plate heat sink showing a number of multi-layer switch substrates physically and thermally coupling respective switches of the rectifier to the integrated base plate heat sink according to one illustrated embodiment.
Figure 2C:
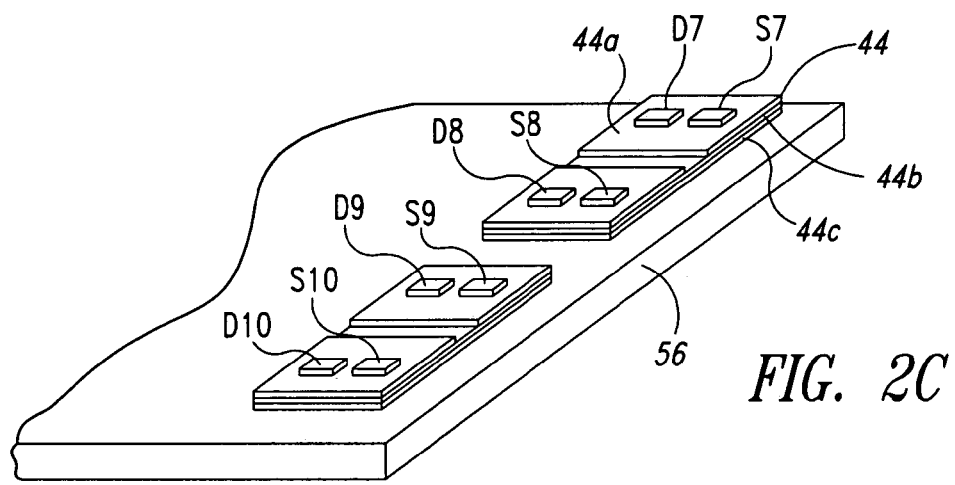
FIG. 2C is a top front left isometric view of a portion of an integrated base plate heat sink showing two multi-layer switch substrates each comprising two distinct areas formed in an electrically and thermally coupled layer to physically and thermally couple respective switches of the rectifier to the integrated base plate heat sink, according to another illustrated embodiment.
Figure 2D:
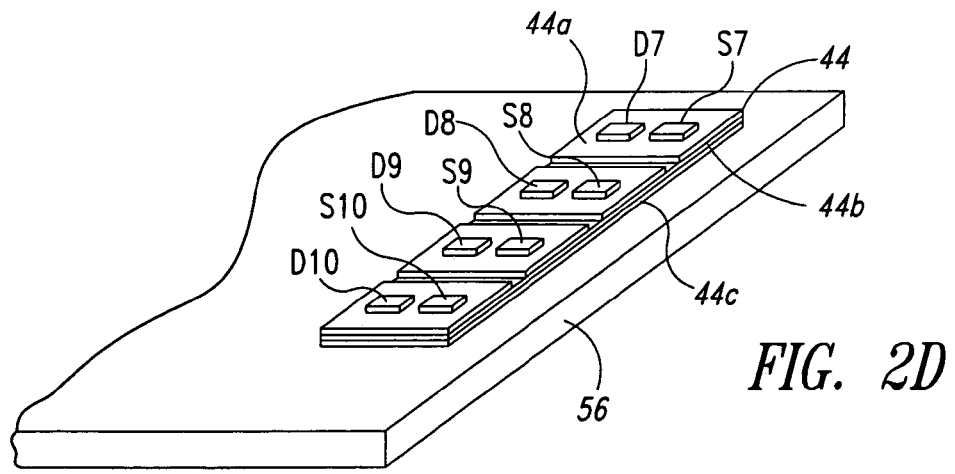
FIG. 2D is a top front left isometric view of a portion of an integrated base plate heat sink showing a single multi-layer switch substrate comprising four distinct areas formed in an electrically and thermally coupled layer to physically and thermally couple respective switches of the rectifier to the integrated base plate heat sink, according to another illustrated embodiment.

FIGS. 2B–2D show how the power semiconductor switches S7–S10 and power semiconductor diodes D7–D10 of the rectifier 14 are physically mounted and thermally coupled to the integrated base plate heat sink 56 by one or more multi-layer switch substrates 44, according to a number of illustrated embodiments. The multi-layer switch substrates 44 comprise a first layer 44a that is electrically and thermally conductive, a second layer 44b that is electrically insulative and thermally conductive, and a third layer 44c that is electrically and thermally conductive. In some embodiments, the multi-layer switch substrate 44 may comprise a greater number of layers.

In particular, FIG. 2B shows one embodiment in which a number of multi-layer switch substrates 44 are provided, one for each of the power semiconductor devices S7–S10 and associated power semiconductor diodes D7–D10 forming the rectifier 14. Thus, this embodiment of FIG. 2B may include a total of four separate multi-layer switch substrates 44 for the rectifier 14.

FIG. 2C shows another embodiment in which a number of multi-layer switch substrates 44 are provided, one for each leg 14a, 14b of the rectifier 14. In such an embodiment, the electrically and thermally conductive layer 44a of each of the multi-layer substrates 44 form distinct areas for mounting each of the power semiconductor devices S7–S10 and associated power semiconductor diodes D7–D10 forming the respective leg 14a, 14b of the rectifier 14.

FIG. 2D shows still a further embodiment in which a single multi-layer switch substrate 44 is provided for forming entire the rectifier 14. A number of distinct areas are formed in the first electrically and thermally conductive layer 44a, the areas being electrically isolated from one another. In this embodiment, there is one area for each of the power semiconductor devices S7–S10 and associated power semiconductor diodes D7–D10 forming the rectifier 14, thus a total of four distinct areas.

Generally, the inclusion of fewer individual multi-layer substrates 44, 70 reduces the parts count, and may reduce the number of manufacturing operations, although forming distinct areas may offset some of the savings in manufacturing operations. However, such a reduction in number is typically accompanied by an increase in size of the remaining multi-layer substrate(s) 44, 70. This increase in size increases the stresses to which the multi-layer substrates 44, 70 are subject, and thus increases the likelihood of defects occurring, such as cracks developing, for example, from solder reflow.

Figure 3:
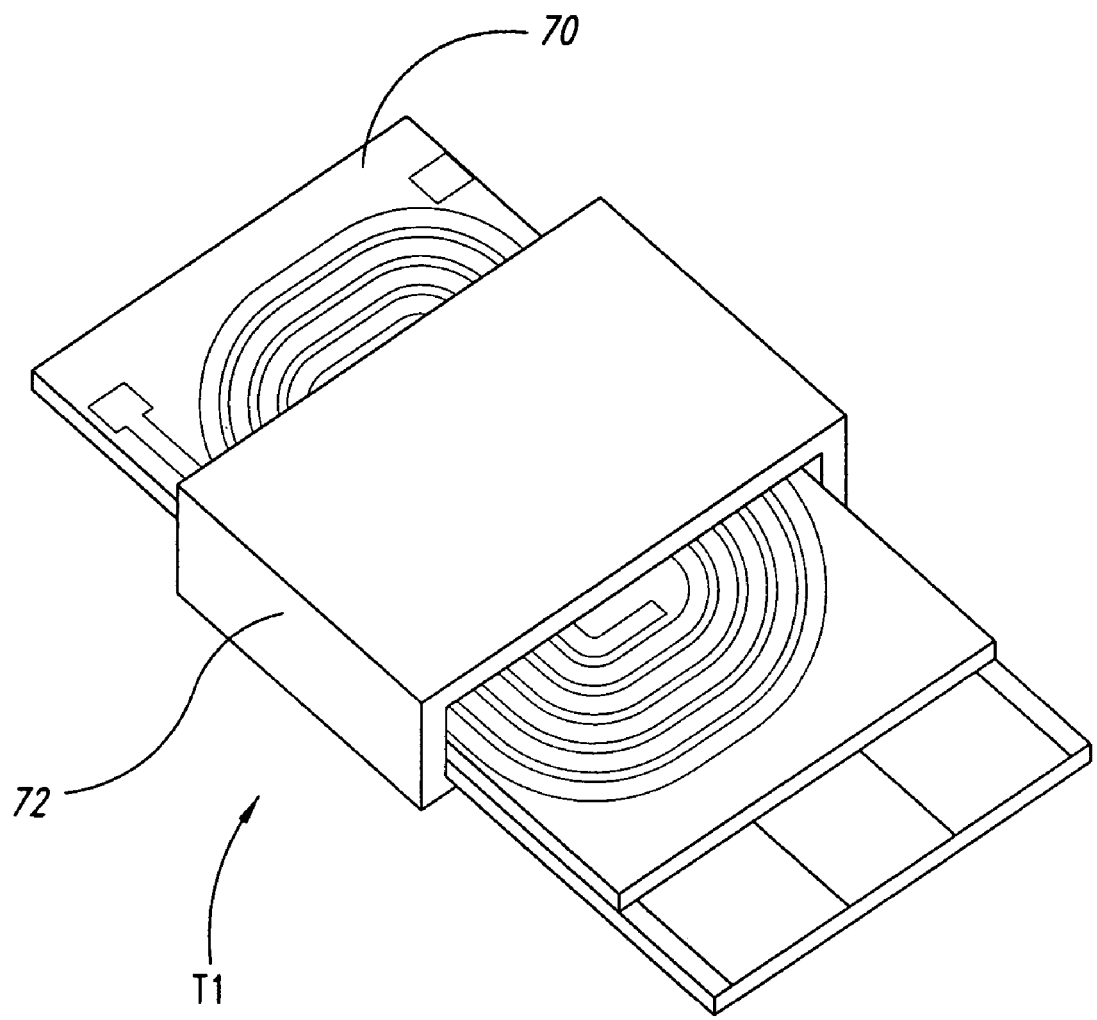
FIG. 3 is a top front left isometric view of one of the planar transformers, according to one illustrated embodiment.
Figure 4:
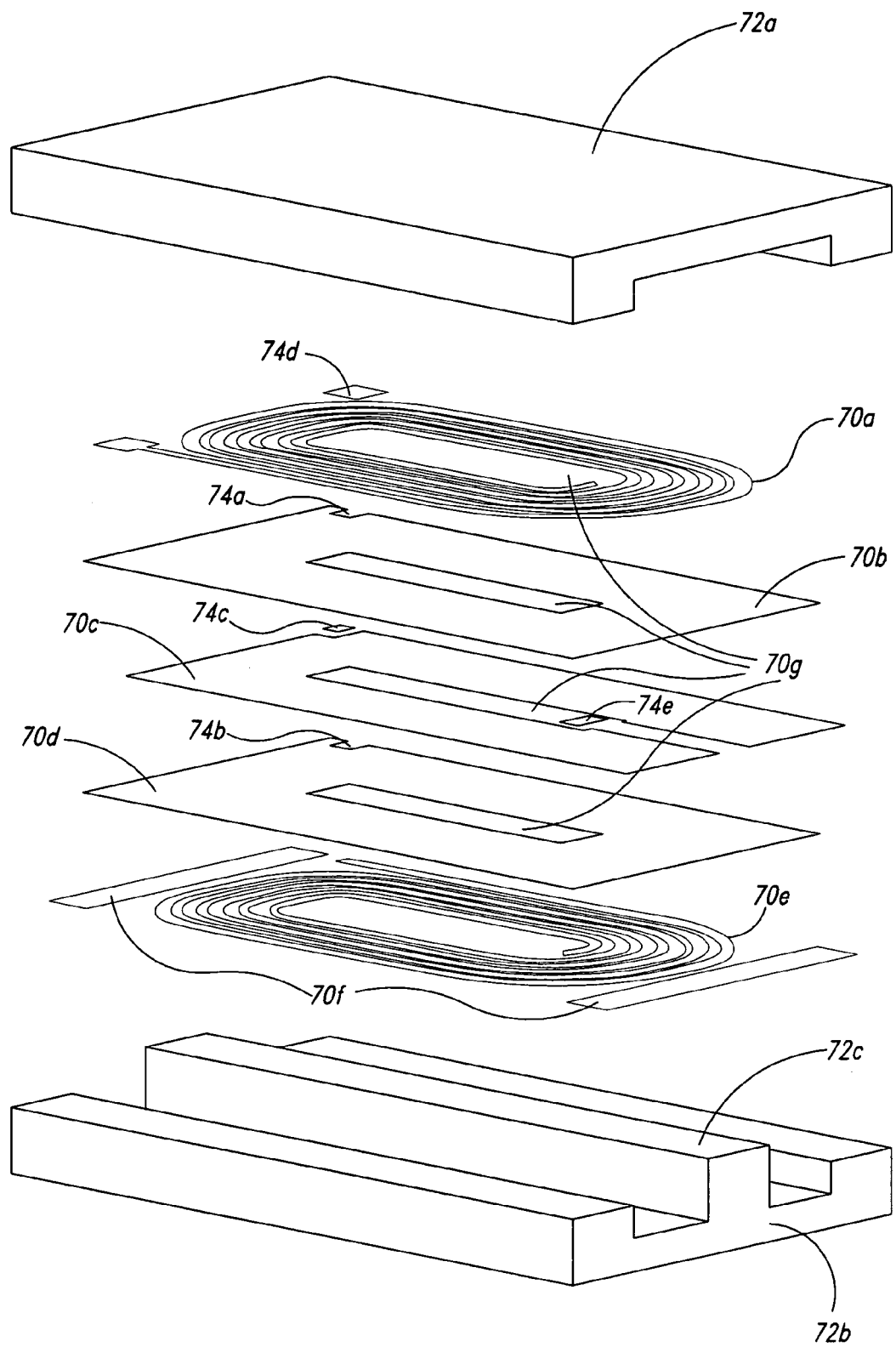
FIG. 4 is an exploded top left front isometric view of the planar transformer of FIG. 3.

FIGS. 3 and 4 show one of the transformers T1 in more detail. The second transformer T2 may have a similar construction to that of the first transformer T1.

The transformer T1 comprises a multi-layer transformer substrate 70 and magnetic core 72. The multi-layer transformer substrate 70 includes a first layer 70a that is electrically and thermally conductive, a second layer 70b that is electrically insulative and thermally conductive, a third layer 70c that is electrically and thermally conductive, a fourth layer 70d that is electrically insulative and thermally conductive, and a fifth layer 70f that is electrically and thermally conductive. The multi-layer transformer substrate 70 may include a greater number of layers to vary the performance of the transformer T1, for example, by varying the number of layers and hence the ratio of "turns" between the primary and secondary windings of the transformer and/or by reducing eddy currents.

The first layer 70a and fifth layer 70e are patterned to form portions of a first winding, and electrically coupled through vias 74a, 74b and connecting pads 74c, 74d, 74e to form the first winding. The third layer 70c is also patterned to form a second winding. While the Figures illustrate the first winding comprising more layers than the second winding, in some embodiments the second winding may comprises more layers than the first winding, or may the first and second windings may comprises the same number of layers.

The fifth layer 70e may be further patterned to form mounting areas 70f for attaching the multi-layer transformer substrate 70 to the heat sink 56, for example by soldering. This reduces the coupling area between the multi-layer substrate 70 and the integrated base plate heat sink 56 reducing associated stresses and the likelihood of imperfections developing such as cracking, for example, during solder reflow.

The magnetic core 72 may include two or more portions 72a, 72b that wraparound the first and second windings of the multi-layer transformer substrate 70. A portion 72c of the magnetic core 72 may be received through an opening 70g formed in each of the layers 70a–70e of the multi-layer transformer substrate 70.

The multi-layer transformer substrate 70 may be formed using a variety of techniques and materials, for example, the multi-layer substrates 70 may take the form of direct bonded copper (DBC) substrates available, for example, from Curamik Electronics of Addison, Tex. Additionally or alternatively, the multi-layer substrates 70 may take the form of insulated metal substrates (IMS) available, for example, from Bergquist Company of Chanhassen, Minn.

The electrically and thermally conductive layers may take a variety of forms such as copper, aluminum and/or other good electrical and thermal conductors. While typically provided in the form of a film, the electrically and thermally conductive layers may take other forms, for example, stamped sheet metal. The electrically insulative and thermally conductive layers may, for example, take the form of a thermally enhanced polyimide film such as Kapton® film, available from Du Pont de Nemours, High Performance Materials of Circleville, Ohio. Additionally, or alternatively, the electrically insulative and thermally conductive layers may, for example, take the from of a suitable ceramic, such as an alumina, aluminum nitride and/or silicon nitride ceramic. In one embodiment, the multi-layer transformer substrate 70 takes the form of layers of stamped sheet metal that are laminated together with insulative layers such as Mylar® film, available from Du Pont de Nemours, High Performance Materials of Circleville, Ohio, using an adhesive such as an epoxy based adhesive.

The multi-layer switch and transformer substrates 44, 70 may be attached to the integrated base plate heat sink 56 via solder reflow techniques. For example, the power semiconductor switches S1–S10 and power semiconductor diodes D1–D10 may be soldered onto respective multi-layer substrates 44, 70, which are then positioned on the integrated base plate heat sink 56. The multi-layer substrates 44, 70 are then soldered to the integrated base plate heat sink 56 at a same time and/or in a single act, for example, via heating in an oven using solder reflow techniques.

Alternatively, the multi-layer substrates 44, 70 may be positioned on the integrated base plate heat sink 56, the power semiconductor switches S1–S10 and power semiconductor diodes D1–D10 may be positioned on the multi-layer substrates 44, 70. The connections between the power semiconductor switches S1–S10 and power semiconductor diodes D1–D10 and between the multi-layer substrates 44, 70 and the integrated base plate heat sink 56, may be made at a same time and/or in a single act, for example, via heating in an oven using solder reflow techniques.

The described techniques may reduce the number of acts involved in manufacturing the power module thereby reducing manufacturing costs, and also subject the various elements to less thermal cycles advantageously increasing reliability and throughput.

FIG. 5A shows the power module 50 according to another illustrated embodiment, housing the entire power converter 10 of FIG. 1; other than the controller 24. In particular, the power module 50 of FIG. 5A includes the inverter 12, rectifier 14 and transformers T1 T2. A pair of terminals 20a, 20b allow electrical connections to be made to the power source VI. Three terminals 18a, 18b, 18c allow electrical connections to be made to the load(s) R1, R2. The terminals 18a, 18c may be formed as bus bars 80a, 80b. Terminals or connectors such as pins 85a–85f, receive control signals 26 from the controller 24 for operating the power semiconductor switches S1–S6 of the inverter. The power semiconductor switches S1–S6 and associated power semiconductor diodes D1–D6 of the inverter 12 may advantageously be electrically coupled to the first sides T1a, T2a of the transformers T1, T2 via wire bonds 81, only a few of which are illustrated. The first sides T1a, T2a of the transformers T1, T2 may advantageously be electrically coupled to the power semiconductor switches S7–S10 and associated power semiconductor diodes D7–D10 of the rectifier 14 via wire bonds 83, only a few of which are illustrated.

In the embodiment of FIG. 5A, the power module 50 may include one or more additional multi-layer switch substrates 44 for mounting the power semiconductor switches S1–S10 and associated power semiconductor diodes D1–D10 forming the inverter 12 to the integrated base plate heat sink 56.

For example, the power module 50 may comprise a separate multi-layer switch substrate 44 for each of the power semiconductor switches S1–S6 and associated power semiconductor diodes D1–D6 pairs of the inverter 12; in fashion similar to that shown in FIG. 2B for the rectifier 14. Thus, the power module 50 may include six separate multi-layer switch substrates 44 for the inverter 12.

Also for example, the power module 50 may comprise a separate multi-layer switch substrate 44 for each phase leg 12a–12c of the inverter 12. The electrically conductive layer 44a of each multi-layer switch substrate 44 is formed into two distinct areas, one for each of the power semiconductor switches S1–S6 and associated power semiconductor diodes D1–D6 of the respective phase leg 12a–12c, in a similar fashion to that of FIG. 2D for the rectifier 14. Thus, the power module 50 may include three additional multi-layer switch substrates 44 for the inverter 12.

In a further example, the power module 50 may comprise a single additional multi-layer switch substrate 44 for mounting all of the power semiconductor switches S1–S6 and associated power semiconductor diodes D1–D6 of the inverter 12, in a similar fashion to that of FIG. 2D for the rectifier 14. Thus, the multi-layer switch substrate 44 may include six distinct areas formed in the electrically and thermally conductive layer 44a, one area for each: power semiconductor S1–S6 and associated diode D1–D6 pair.

In addition to the embodiments discussed above, a further embodiment illustrated in FIG. 5B shows a single multi-layer switch substrate 44 for mounting the power semiconductor switches S1–S6 and associated power semiconductor diodes D1–D6 forming the inverter 12, along with the power semiconductor devices S7–S10 and associated power semiconductor diodes D7–D10 forming the rectifier 14. Thus, such an embodiment may include ten distinct areas formed in the first electrically and thermally conductive layer 44a, the areas electrically isolated from one another.

FIG. 5C shows a single multi-layer switch substrate 70 comprising at least three electrically and thermally conductive layers 70a, 70c, 70e and at least two electrically insulative and thermally conductive layers 70b, 70d separating respective pairs of the electrically and thermally conductive layers 70a–70c, 70c–70e. The second electrically and thermally conductive layer 70c of the multi-layer switch substrate 70 form ten distinct areas. The areas are electrically isolated from one another, for mounting the power semiconductor switches S1–S6 and associated power semiconductor diodes D1–D6 (not shown in FIG. 5C) forming the inverter 12, and the power semiconductor devices S7–S10 and associated power semiconductor diodes D7–D10 (not shown in FIG. 5C) forming the rectifier 14, in a similar fashion to that illustrated in FIG. 5B. At least the first and third electrically and thermally conductive layers 70a, 70e, are patterned and electrically coupled to one another to form a first winding of a transformer T1, T2. At least the second electrically and thermally conductive layer 70c is patterned to form a second winding of the transformer T1, T2.

While FIG. 5C illustrates three electrically and thermally conductive layers 70a, 70c, 70e and two electrically insulative and thermally conductive layers 70b, 70d, the multi-layer substrate 70 may include a greater number of layers. Further while the power semiconductor devices S1–S10, D1–D10 are illustrated as mounted to the second electrically and thermally conductive layer, some or all of those power semiconductor devices may be mounted on other ones of the electrically and thermally conductive layers.

FIG. 5D shows a portion of an integrated base plate heat sink similar to that of FIG. 5C, illustrating the use of one of the second electrically and thermally conductive layer 70c of the multi-layer substrate 70 to electrically couple the second sides T1b, T2b of the transformers T1, T2 to respective terminals (e.g., drain/collector) of the power semiconductor switches S7–S10 and/or power semiconductor diodes D7–D10 of the rectifier 14, advantageously eliminating a number of the wire bonds. Other embodiments may employ the same or other electrically and thermally conductive layers 70a, 70c, 70e, in a similar manner, for example, to eliminate wire bonds.

FIG. 6 shows the integrated base plate heat sink 56 according to one embodiment. The integrated base plate heat sink 56 may comprise a plate section 56a and conduit section 56b. The plate section 56a includes a top surface 82 having a pair of recesses 82a, 82b sized and dimensioned to receive a portion of the magnetic core 72 such as the portion 72b such that the multi-layer transformer substrate 70 is flush with the surface 82. The conduit section 56b comprises an inlet 84a, an outlet 84b and a passage formed by first passage section 86a and second passage section 86b which are fluidly communicatingly coupled with the intake 84a and outtake 84b. The plate 82 may include thermal radiating structures such as fins or pins 87 on a surface opposed to the top surface 82 which are received in the portions 86a, 86b for transferring heat from the plate 56a to a fluid passing through the conduit portions 86a, 86b. The power converter 10 may include a circulation system (not shown) including, for example, a pump, compressor, and/or fan for circulating fluid through the conduit portions 86a, 86b to assist in transferring heat from the integrated base plate heat sink 56. While shown as an integrated base plate heat sink 56, other embodiment may employ other forms of heat sinks.

FIG. 7 shows a timing diagram illustrating switching signals applied to the semiconductor switches S1–S6 of the inverter 12, the voltage $U_{AB}$ applied to the first side T1a of the transformer T1 and the voltage $U_{BC}$ applied to the first side T2a of the second transformer T2 at various time intervals $t_0$–$t_{12}$ over a period $T_s$. FIG. 7 also shows the current output $I_{L1}$–$I_{L4}$ of the filter inductors L1–L4, respectively.

The power semiconductor switches S1–S6 (FIG. 1) of each phase leg 12a–12c of the inverter 12 each generate a nearly 50% duty cycle square waveform. The first and second phase legs 12a, 12b of the inverter 12 are phase shift controlled to generate a three-level square waveform $U_{AB}$ applied to the first side or winding T1a of the first transformer T1. The second leg 12b and third leg 12c of the inverter 12 are phase shifted controlled to generate a three-level square wave form $U_{BC}$ to the first side or winding T2a of the second transformer T2. Thus, phase B is shared by the transformers T1, T2 to form the equivalent of two conventional full bridge DC/DC converters, while advantageously saving one high voltage leg (i.e., at least two power semiconductor switches and associated power semiconductor diodes) and gate driver circuit.

The two outputs $U_{AB}$ and $U_{BC}$ are phase locked to each other, so that the second phase leg 12b (phase B) can achieve a wide soft-switching range by means of the load current in the transformers T1. The soft switching is achieve by the energy stored in the filter inductors L1–L4, without relying on the energy stored in the leakage inductance of the transformers T1. The output voltage Vout1 is regulated by a phase shift angle $\phi_{AB}$, and the output voltage Vout2 is regulated by a phase shift angle $\phi_{BC}$. The power converter 10 can be configured as either single output or dual output. In single output configuration, the outputs Vout1 and Vout2 are paralleled together to double the output current/power. If Vout1 and Vout2 are paralleled together in a single output voltage configuration, the phase shift angles $\phi_{AB}$, $\phi_{BC}$ are equal. In the dual output configuration Vout1 and Vout2 may be controlled independently.

The interleaved full bridge DC/DC power converter 10 described above doubles output power capability while operating at a high coolant temperature (e.g., 105° C.) and maintaining current and thermal stress at acceptable levels to provide high reliability. Soft switching is achieved over a wide range of loads, reducing switching losses and providing high efficiency operation by means of the load currents in the transformers T1, T2 and filter inductors L1–L4. Thus, the described power converter may efficiently provide high power conversion, with high power density and high coolant temperature. The interleaving also advantageously reduces high frequency ripple current to the input and output capacitors CI, CO1, CO1. Sharing of a phase leg 12a–12c of the inverter 12 allows the use of one less inverter phase leg (i.e., at least two power semiconductor switches and associated diodes) than would typically be required, reducing parts count, complexity, and cost while increasing reliability. The power converter 10 is further easily configurable as either a single or dual output unit.

The integration of planar transformers in the power converter 10 described above, avoids the use of conventional air-cooled heavy copper printed circuit board windings. The integration of planar transformers may allow a reduction in Ohmic losses and inductance related to contacts, which are particularly problematic at high frequencies, by employing direct wire bonding connections as described above. Leakage inductance and AC loss may be reduced by employing the flat winding structure of the planar transformers T1, T2. The use of planar transformers in the described power converter 10 may advantageously allow an increase in the magnetic core window utilization ratio, a reduction in the magnetic core value, and an increase in power density. The power converter 10 described above may also provide enhanced EMI performance.

Although specific embodiments of and examples for the power converter and method are described herein for illustrative purposes, various equivalent modifications can be made without departing from the spirit and scope of the invention, as will be recognized by those skilled in the relevant art. The teachings provided herein can be applied to power converters, not necessarily the DC/DC interleaved power converter with planar transformers generally described above.

For example, the power converter 10 may share the first or third phase legs 12a, 12c, rather than the second phase leg 12b. Also for example, the teachings are not limited to a three phase inverter 12, but may be applied to inverters with an even greater number of phase legs, for example, to provide even high power. For example, the power converter 10 may comprise a fourth phase leg added to the inverter 12, and a third transformer electrically coupled between the third phase leg 12c and the added phase leg. The power converter may also comprise two filter inductors, along with adding power semiconductor switches and associated diodes to the rectifier which are supplied from the second side of the third transformer to provide a power increase of 50%. Also for example, synchronized rectification is optional, and may be omitted in some embodiments, for example being replaced by a diode rectifier. As a further example, the integrated planar transforms may be advantageously employed in other power converters such as inverters and/or rectifiers. As an even further example, the interleaving may be advantageously employed without the integrated planar transformers.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to commonly assigned U.S. patent application Ser. No. 10/738,926 filed Dec. 16, 2003, and entitled "Power Module With Heat Exchange"; and U.S. patent application Ser. No. 10/688,834, filed Oct. 16, 2003, and entitled "Power Converter Employing A Planar Transformer"; and U.S. patent application Ser. No. 60/560.755, filed Jun. 4, 2004, and entitled "Integration of Planar Transformer and Power Switches in Power Converters" are incorporated herein by reference, in their entirety. Aspects of the invention can be modified, if necessary, to employ systems, circuits and concepts of the various patents, applications and publications to provide yet further embodiments of the invention.

These and other changes can be made to the invention in light of the above-detailed description. In general, in the following claims, the terms used should not be construed to limit the invention to the specific embodiments disclosed in the specification and the claims, but should be construed to include all power converters. Accordingly, the invention is not limited by the disclosure, but instead its scope is to be determined entirely by the following claims.

The invention claimed is:

1. A power converter, comprising:
an inverter circuit comprising a first phase leg comprising a first node, a second phase leg comprising a second node, and a third phase leg comprising a third node;
a first transformer comprising a first side and a second side, the first side of the first transformer electrically coupled between the first node of the first phase leg and the second node of the second phase leg of the inverter circuit; and
a second transformer comprising a first side and a second side, the first side of the second transformer electrically coupled between the second node of the second phase leg and the third node of the third phase leg of the inverter circuit.

2. The power converter of claim 1 wherein each of the first, the second and the third phase legs comprise a respective pair of power switching elements, one of the power switching elements in the pair electrically coupled between a first rail of a power bus and the respective one of the first, the second, or the third nodes, and the other one of the power switching elements in the pair electrically coupled between a second rail of the power bus and the respective one of the first, the second, or the third nodes.

3. The power converter of claim 2, further comprising:
a current doubler rectifier electrically coupled to the second sides of the first and the second transformers.

4. A power converter, comprising:
an inverter circuit comprising a first phase leg comprising a first node, a second phase leg comprising a second node, and a third phase leg comprising a third node;
a first transformer comprising a first side and a second side, the first side of the first transformer electrically coupled between the first node of the first phase leg and the second node of the second phase leg of the inverter circuit;
a second transformer comprising a first side and a second side, the first side of the second transformer electrically coupled between the second node of the second phase leg and the third node of the third phase leg of the inverter circuit, wherein each of the first, the second and the third phase legs comprise a respective pair of power switching elements, one of the power switching elements in the pair electrically coupled between a first rail of a power bus and the respective one of the first, the second, or the third nodes, and the other one of the power switching elements in the pair electrically coupled between a second rail of the power bus and the respective one of the first, the second, or the third nodes; and a current doubler rectifier electrically coupled to the second sides of the first and the second transformers, the current doubler rectifier including:
a first pair of switches electrically coupled in series between a first pole of the second side of the first transformer and a first pole of the second side of the second transformer, a first rectifier node formed between the switches of the first pair of switches, and
a second pair of switches electrically coupled in series between a second pole of the second side of the first transformer and a second pole of the second side of the second transformer, a second rectifier node formed between the switches of the second pair of switches, the second rectifier node electrically coupled to the first rectifier node.

5. A power converter, comprising:
an inverter circuit comprising a first phase leg comprising a first node, a second phase leg comprising a second node, and a third phase leg comprising a third node;
a first transformer comprising a first side and a second side, the first side of the first transformer electrically coupled between the first node of the first phase leg and the second node of the second phase leg of the inverter circuit;
a second transformer comprising a first side and a second side, the first side of the second transformer electrically coupled between the second node of the second phase leg and the third node of the third phase leg of the inverter circuit, wherein each of the first, the second and the third phase legs comprise a respective pair of power switching elements, one of the power switching elements in the pair electrically coupled between a first rail of a power bus and the respective one of the first, the second, or the third nodes, and the other one of the power switching elements in the pair electrically coupled between a second rail of the power bus and the respective one of the first, the second, or the third nodes;
a current doubler rectifier electrically coupled to the second sides of the first and the second transformers, the current doubler rectifier including:
a first pair of switches electrically coupled in series between a first pole of the second side of the first transformer and a first pole of the second side of the second transformer, a first rectifier node formed between the switches of the first pair of switches, and
a second pair of switches electrically coupled in series between a second pole of the second side of the first transformer and a second pole of the second side of the second transformer, a second rectifier node formed between the switches of the second pair of switches, the second rectifier node electrically coupled to the first rectifier node; and a controller communicatingly coupled to control operation of the power switching elements of the first, the second and the third phase legs of the inverter circuit, and to control operation of the first and the second pairs of switches of the current doubler rectifier.

6. The power converter of claim 3, further comprising:
a first inductor electrically coupled in series with a first pole of the second side of the first transformer;
a second inductor electrically coupled in series with a second pole of the second side of the first transformer;
a third inductor electrically coupled in series with a first pole of the second side of the second transformer; and
a fourth inductor electrically coupled in series with a second pole of the second side of the second transformer.

7. The power converter of claim 6, further comprising:
a first capacitance comprising a first pole and a second pole, the first pole of the first capacitance electrically coupled to the first and the second inductors at a first potential node; and
a second capacitance comprising a first pole and a second pole, the second pole of the second capacitance electrically coupled to the third and the fourth inductors at a third potential node, the first pole of the second capacitance electrically coupled to the second pole of the first capacitance at a second potential node.

8. The power converter of claim 7, further comprising:
electrically coupling a single load across the first and second potential nodes and in parallel with the second and the third potential nodes.

9. The power converter of claim 7, further comprising:
electrically coupling a first load across the first and the second potential nodes; and
electrically coupling a second load across the second and the third potential nodes.

10. The power converter of claim 2 wherein each of the power switching elements comprises at least one high power transistor and at least one anti-parallel diode electrically coupled across the at least one high power transistor.

11. The power converter of claim 2 wherein each of the power switching elements comprises at least one insulated gate bipolar transistor.

12. The power converter of claim 2 where in each of the power switching elements comprises at least one metal oxide semiconductor field effect transistor.

13. The power converter of claim 1 wherein the first and the second transformers are planar transformers, and the number of turns in the first side of the first and the second transformers is greater than the number of turns in the second side of the first and the second transformers.

14. The power converter of claim 1 wherein the number of turns in the first side of the first and the second transformers is less than the number of turns in the second side of the first and the second transformers.

15. A method of converting power, comprising:
inverting a direct current to produce at least three phases of alternating current;
supplying a first and a second of the three phases of alternating current to a first side of a first transformer to induce an alternating current on a second side of the first transformer;

supplying the second and a third of the three phases of alternating current to a first side of a second transformer to induce an alternating current on a second side of the second transformer;
supplying the alternating current from the second side of the first transformer to a rectifier;
supplying the alternating current from the second side of the second transformer to the rectifier; and
rectifying the first and the second alternating currents supplied to the rectifier from the second sides of the first and the second transformers, respectively, to produce a first voltage across a first potential node and a second potential node and to produce a second voltage across the second potential node and a third potential node.

16. The method of claim 15 wherein the second voltage across the second potential node and the third potential node is approximately equal to the first voltage across the first potential node and the second potential node.

17. The method of claim 15, further comprising:
inductively coupling the alternating current from the second side of the first transformer to the first and the second potential nodes; and
inductively coupling the alternating current from the second side of the second transformer to the second and the third potential nodes.

18. The method of claim 15, further comprising:
phase locking the phases of alternating current supplied to the first side of the first transformer with the phases of the alternating current supplied to the first side of the second transformer.

19. The method of claim 15 wherein supplying a first and a second of the three phases of alternating current to a first side of a first transformer comprises generating a three-level square waveform to the primary winding of the first transformer, and wherein supplying the second and a third phases of the three phases of alternating current to a first side of a second transformer comprises generating a three-level square waveform to the primary winding of the second transformer.

20. The method of claim 19 wherein generating a three-level square waveform to the primary winding of the first transformer comprises phase shift controlling a high side and a low side switch of each of a first and a second leg of an inverter circuit.

21. The method of claim 15, further comprising:
electrically coupling the first and the second voltages in parallel to a load.

22. A power converter, comprising:
a first transformer comprising a first side including at least a first pole and a second pole, and a second side including at least a first pole and a second pole;
a second transformer comprising a first side including at least a first pole and a second pole, and a second side including at least a first pole and a second pole;
means for supplying a first phase of alternating current to the first pole of the first side of the first transformer, a second phase of alternating current to the second pole of the first side of the first transformer and to the first pole of the first side of the second transformer, and a third phase of alternating current to the second pole of the first side of the second transformer; and means for current double rectifying alternating currents supplied from the second sides of the first and the second transformers.

23. The power converter of claim 22 wherein the means for current double rectifying produces a first voltage across a first potential node and a second potential node and to produces a second voltage across the second potential node and a third potential node.

24. The power converter of claim 23 wherein an output across the first and the second potential nodes is electrically coupled in parallel with an output across the third and the second potential nodes.

25. The power converter of claim 23 wherein an output across the first and the second potential nodes is independently controllable with respect to an output across the third and the second potential nodes.

26. The power converter of claim 22, further comprising:
a number of inductors, each of the inductors electrically coupled in series with a respective one of the poles of the second sides of the first and the second transformers.

27. The power converter of claim 22, further comprising:
a first capacitor electrically coupled in parallel across a first and a second potential nodes; and
a second capacitor electrically coupled in parallel across the second and a third potential nodes.

* * * * *